(12) United States Patent
Bates, III et al.

(10) Patent No.: US 6,330,163 B1
(45) Date of Patent: Dec. 11, 2001

(54) IC CARD WITH CARDBUS BRIDGE

(75) Inventors: Charles Linsday Bates, III, Laguna Hills; Jay Brian Betker, Yorba Linda, both of CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/624,404

(22) Filed: Jul. 24, 2000

(51) Int. Cl.$^7$ ...................................................... H05K 1/14
(52) U.S. Cl. ............................ 361/737; 361/736; 361/800; 439/76.1
(58) Field of Search .................................... 361/736, 737, 361/724–727, 799, 800; 274/35 R, 51; 439/76.1

(56) References Cited

U.S. PATENT DOCUMENTS

| | | | |
|---|---|---|---|
| 5,244,397 | * 9/1993 | Anhalt ................................... | 439/101 |
| 5,476,387 | * 12/1995 | Ramey et al. ....................... | 439/76.1 |
| 5,493,477 | * 2/1996 | Hirai ..................................... | 361/737 |
| 5,563,770 | * 10/1996 | Bethurum ............................. | 361/737 |
| 5,563,771 | * 10/1996 | Bethurum ............................. | 361/737 |
| 5,689,405 | * 11/1997 | Bethurum ............................. | 361/737 |
| 5,833,473 |   11/1998 | Betker et al. ......................... | 439/76 |
| 5,896,274 |   4/1999 | Ishida .................................... | 361/737 |
| 5,940,275 |   8/1999 | Laity ..................................... | 361/737 |
| 6,004,144 | * 12/1999 | Yeh et al. ............................. | 439/76.1 |
| 6,106,309 | * 8/2000 | Kakinoki .............................. | 439/92 |
| 6,181,564 | * 1/2001 | Furusho ................................ | 361/737 |

* cited by examiner

Primary Examiner—Jayprakash N. Gandhi
Assistant Examiner—Tuan Dinh
(74) Attorney, Agent, or Firm—Robert C. Turner

(57) ABSTRACT

An IC card of the type having a CardBus shield is disclosed in which the dielectric CardBus bridge behind the shield is provided with an upward projection that is positioned behind a front angular part of the top cover of the sheet metal enclosure for the card to support the cover. Preferably, the projection has a front angular surface that conforms to the configuration of the front angular part of the cover. The projection restricts flexural stresses applied to the card and improves environmental sealing of the card.

4 Claims, 2 Drawing Sheets

IC CARD WITH CARDBUS BRIDGE

BACKGROUND OF THE INVENTION

The present invention relates generally to an IC card and, more particularly, to an IC card having a CardBus shield.

IC cards constructed in accordance with PCMCIA (Personal Computer Memory Card International Association) standards, having a CardBus shield for avoiding signal degradation, such as cross-talk between the contacts in the connector of the card, are well known in the art. Examples of such IC cards are disclosed in U.S. Pat. Nos. 5,833,473; 5,896,274; and 5,940,275.

As disclosed in the aforementioned patents, a CardBus IC card has a dielectric CardBus bridge mounted within the sheet metal enclosure of the card for positioning a 68-position connector mounted at the front end of the card. The bridge is located at the rear of a cutout that opens at the front of the top cover of the enclosure. The bridge supports the front part of the top cover at the rear of the cutout. A CardBus shield is mounted on the top of the connector spaced forwardly from the front edge of the top cover. A raised projection on the forward portion of the CardBus bridge fills in the space between the front edge of the top cover and the rear of the CardBus shield to provide environmental sealing for the interior of the card.

Although the raised projection on the CardBus bridge in the conventional CardBus IC card minimizes the ingress of contaminants into the card and offers some degree of aesthetic continuity, it provides no benefit to the card's rigidity, which is inherently compromised by the cutout formed in the top cover of the card's sheet metal enclosure. This cutout allows the connector portion of the card to flex in an upward and downward rotational direction almost entirely unrestricted. The resulting flexural stresses are transferred to the solder joints between the contacts of the 68-position connector, and the conductive pads on the circuit board within the card, and to the solder joints between the tails on the CardBus shield and ground pads on the circuit board, greatly increasing the likelihood of electrical failure. As a result, conventional CardBus IC cards are intrinsically weaker than standard IC cards.

It is the object of the present invention to provide an improved CardBus IC card that has enhanced structural strength that resists flexural stresses applied to the card, and improves environmental sealing for the card.

SUMMARY OF THE INVENTION

According to a principal aspect of the present invention, there is provided an improved CardBus IC card in which the projection on the top of the CardBus bridge is formed adjacent to the rear of the bridge, rather than at the front of the bridge, and is located immediately behind the front angular part of the top cover of the metal enclosure for the card to support the front lateral part of the cover. Preferably, the front surface of the projection has an angular configuration that engages and conforms to the front angular part of the top cover, thereby effectively creating a bend-relief between the bridge and the top cover. This arrangement resists flexural stresses applied to the card and also provides a more effective seal to the inside of the card.

Other aspects and advantages of the invention will become more apparent from the following description taken in connection with the accompanying drawings.

DESCRIPTION OF THE PREFERRED EMBODIMENT

Figure 1:
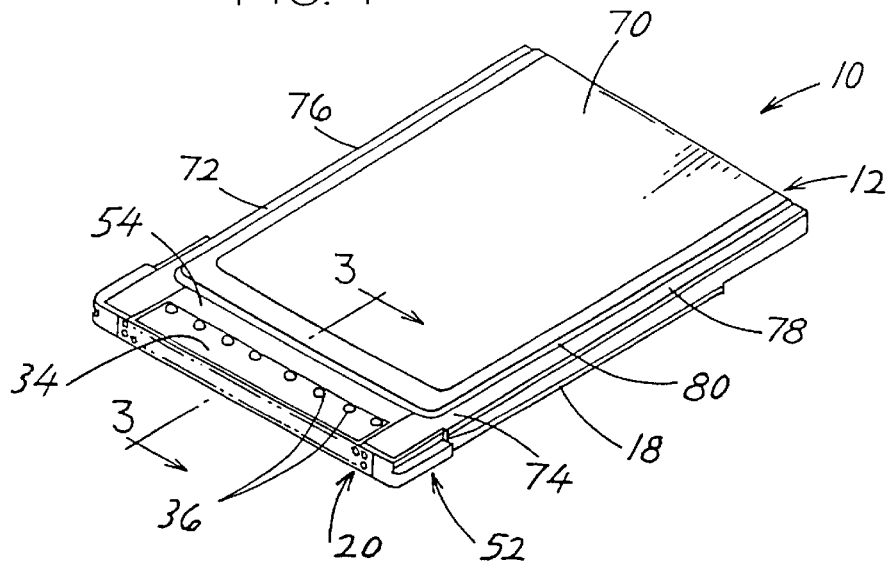
FIG. 1 is a perspective view of an IC card constructed in accordance with the present invention.

Referring now to the drawings in detail, there is shown the IC card of the present invention, generally designated 10, comprising a sheet metal enclosure 12 that encloses a circuit board 14. The enclosure 12 includes a top cover 16 and bottom cover 18. A front connector 20 and rear connector 22 are mounted inside the enclosure adjacent to the front end 24 and rear end 26, respectively, of the circuit board.

The front connector 20 is a CardBus connector of the type disclosed in the patents referred to previously herein. The connector comprises a dielectric housing 28 containing two rows of contact passages 30. Each passage contains a socket contact 32 that is adapted to mate with a pin contact in a host connector (not shown) at the rear of a slot in a personal computer into which the IC card is inserted for use. The connector 20 includes a CardBus shield or ground plate 34 mounted on the top surface of the housing 28 of the connector. The shield includes upstanding bumps 36 that engage a ground plate associated with the host connector.

The contacts 32 in the front connector 20 have tails 38 that engage a row of signal traces 40 on the upper surface of the circuit board 14. The CardBus shield 34 includes tails 42 that engage ground traces 44 on the upper surface of the circuit board positioned in a row behind the row of signal traces 40.

The rear connector 22 contains contacts (not shown) for connecting to the contacts of a cable plug that extends to an accessory, such as a facsimile machine, or to a telephone jack.

The top cover 16 has a cutout 46 at its forward end 48 in which the front connector 20 is positioned when the top and bottom covers are assembled to form the completed IC card. The rear of the cutout 46 forms the forward edge 50 of the top cover, which is positioned behind the CardBus shield 34 to provide a space therebetween.

A dielectric CardBus bridge 52 mounts the front connector 20 on the forward portion of the circuit board 14. The bridge has a crossbeam 54 extending between two laterally opposite mounting sides 56 and 58 that are fixed to the circuit board. The sides 56 and 58 include downwardly extending pegs (not shown) that extend into holes 60 and 62 in the circuit board to precisely position the bridge 52 and, hence, the front connector 20, so that the contact tails 38 and CardBus shield tails 42 will properly engage the traces 40 and 44, respectively, on the circuit board. Solder connections are made between such tails and traces.

The top cover 16 of the sheet metal enclosure 12 has a raised flat upper section 70 and outer flanges 72 and 74 extending along the opposite sides 76 and 78, respectively, of the top cover. An angular section 80 of the cover interconnects the upper section 70 and the outer flanges 72 and 74. The angular section also includes a front angular part 84 extending along the forward part 86 of the cover adjacent to the forward edge 50 thereof.

Figure 3:
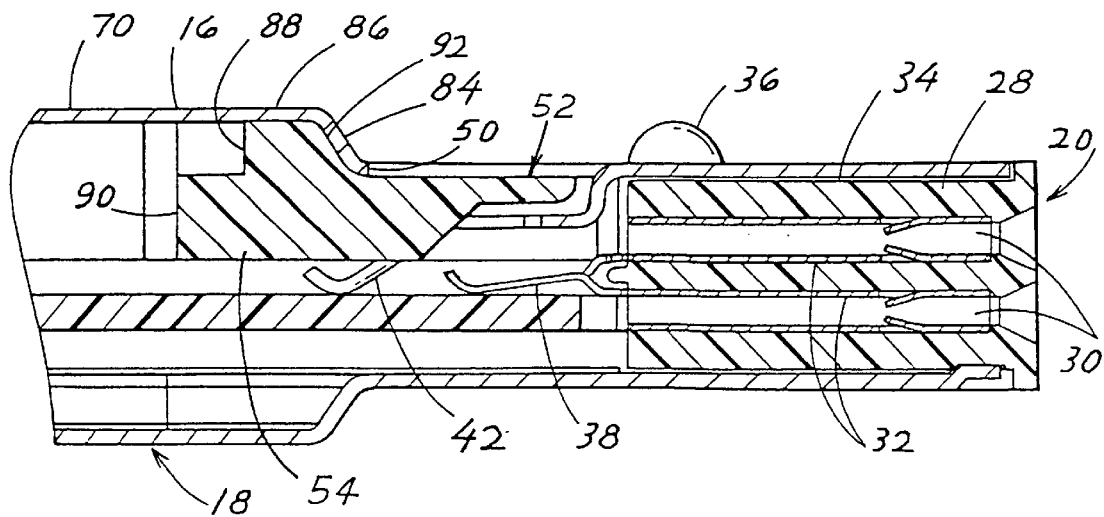
FIG. 3 is an enlarged sectional view taken along line 3—3 of FIG. 1.
Figure 2:
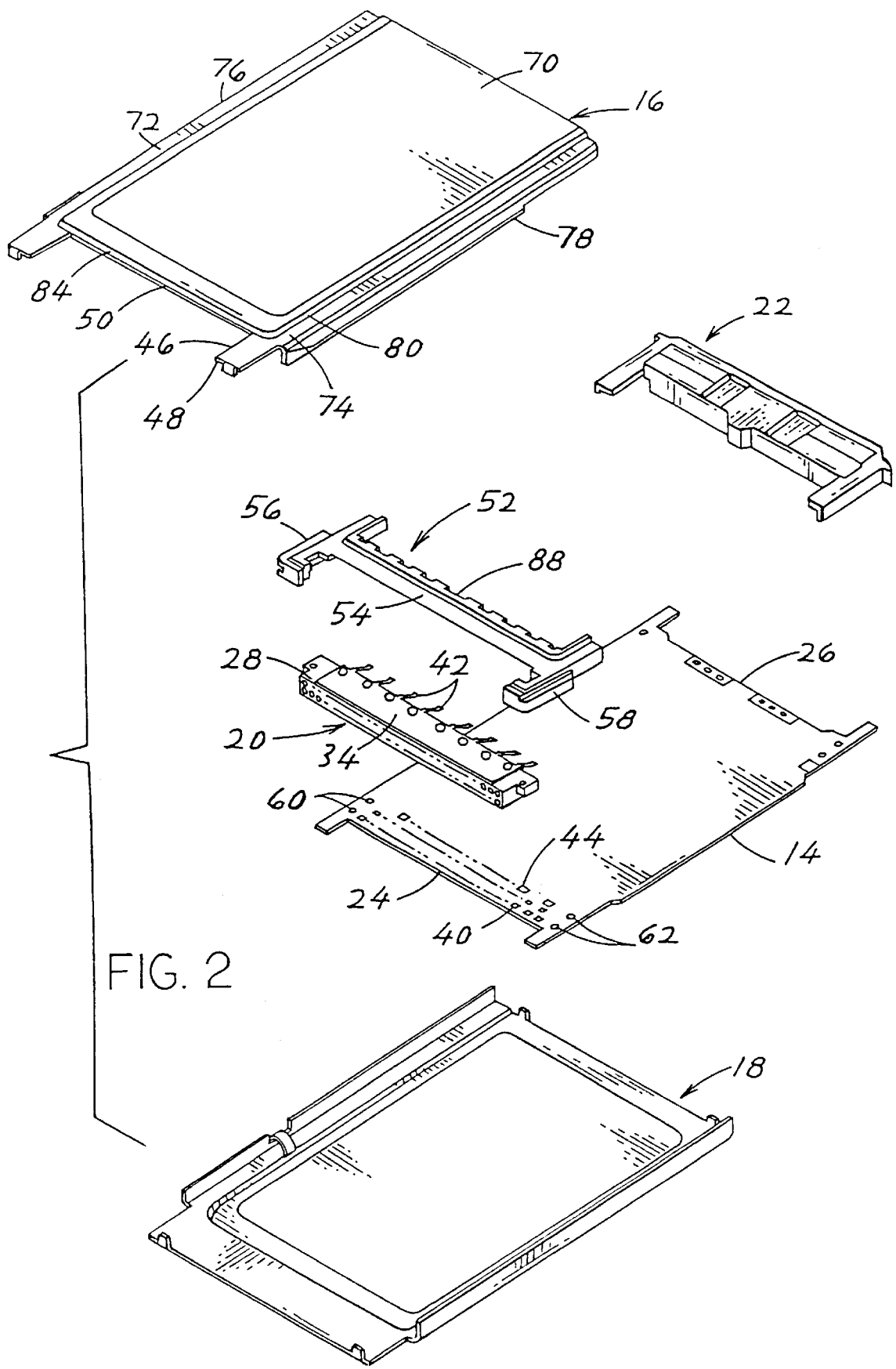
FIG. 2 is an exploded view of the IC card of FIG. 1.

The CardBus IC card described so far is generally the same as that disclosed in the patents previously identified herein. As mentioned previously herein, the CardBus bridge of a conventional CardBus IC card has a raised projection formed on the top of the crossbeam adjacent to the front of the crossbeam to fill the space between the forward edge of the top cover and the rear of the CardBus shield to minimize the ingress of contaminates into the interior of the card. However, such raised projection on the CardBus bridge in the prior art IC cards provides no benefit to the card's rigidity, that is inherently compromised by the cutout at the front of the top cover. The cutout allows the front portion of the card to flex in an upward and downward rotational direction that results in flexural stresses transferred to the solder joints at the ends of the tails of the CardBus shield and the contacts in the CardBus connector, respectively, that greatly increases the likelihood of electrical failure. This problem is overcome by the present invention by locating the laterally extending upward projection 88 on the crossbeam 54 of the CardBus bridge adjacent to the rear 90 of the crossbeam just behind the front angular part 84 of the top cover 16, as best seen in FIG. 3.

The projection 88 supports the forward lateral part 86 of the top cover, and preferably has a front angular surface 92 that conforms to the front angular part 84 of the cover, effectively creating a true bend-relief between the CardBus bridge and the top cover. This arrangement enhances the rigidity of the IC card at its forward end, thereby resisting flexural stresses that might be applied to the card by the user that otherwise occurs due to the cutout at the front part of the top cover. Also, since the projection 88 follows the angular contour of the top cover, it provides a more effective seal to the inside of the cover, thus avoiding the need of a projection on the front part of the crossbeam 54 of the CardBus bridge as used in the conventional CardBus IC cards of the type disclosed in the patents identified hereinabove. The IC card 10 shown in the drawings is a "frameless" type since only the covers and circuit board extend between the front connector 20 and rear connector 22. Alternatively, a molded plastic rectangular frame could be used with a dielectric bridge 52 forming the front of the frame, and the frame supporting the front and rear connectors. Also, in such arrangement the rear connector 22 could be eliminated.

What is claimed is:

1. An IC card comprising:

a circuit board having a front end with laterally opposite sides, at least one laterally extending row of signal traces and at least one secondary ground trace;

a front connector having a dielectric connector housing and at least one row of contacts mounted in said housing having contact tails engaging said signal traces;

a ground plate lying on said connector housing and connected to said secondary ground trace;

a metal enclosure including a sheet metal top cover lying over said circuit board, said top cover having a raised flat upper section with a forward lateral part, outer flanges extending along the opposite sides of said upper section, and an angular section interconnecting said upper section and said outer flanges and including a front angular part extending along said forward part of said upper section and providing a forward edge;

said forward edge of said top cover being spaced rearwardly behind said ground plate and leaving a gap between them;

a dielectric bridge element lying at the front end of said circuit board, said bridge element having a crossbeam and having laterally opposite sides fixed in position with respect to said laterally opposite sides of said circuit board, said dielectric bridge element extending forward from the forward edge of said top cover along a majority of the front-to-rear length of said gap; and said crossbeam having a laterally extending upward projection behind said front angular part supporting said forward part of said top cover upper section, said upward projection extending across substantially the entire width of said dielectric bridge between said laterally opposite sides of said circuit board.

2. An IC card as set forth in claim 1 wherein:

said IC card is frameless in that there is no dielectric frame extending along the entire periphery of the metal enclosure, and said dielectric bridge lies only at the front end of said IC card, said circuit board having holes at laterally opposite sides of said circuit board front end and said dielectric bridge having pegs that project into said holes in said circuit board.

3. An IC card as set forth in claim 1 wherein:

said crossbeam is devoid of an upward projection between said forward edge of said top cover and said ground plate.

4. An IC card which has front and rear ends and that includes a circuit board having laterally opposite sides, a front connector with a dielectric housing and with contacts lying in said housing and connected to said circuit board, a cardbus shield that includes a ground plate lying on said housing and having a rear end, and a sheet metal enclosure that surrounds said circuit board, said enclosure including a sheet metal top cover with an upper section lying in a horizontal plane, said upper section having a front end, and said top cover having a front angular part extending at a forward-downward incline from said upper section front end, and said top cover having a front edge, where said front edge lies behind said ground plate, comprising:

a dielectric bridge which lies solely at said IC card front end and which has laterally opposite sides fixed in position with respect to said circuit board opposite sides, said dielectric bridge extending forwardly most of the distance between said top cover front edge and said ground plate rear end, to minimize open space between said cover front edge and said ground plate rear end through which debris can enter the IC card;

said dielectric bridge having an upward projection that lies under and against said front end of said top cover upper section, to support said front end of said top cover upper section.

* * * * *